United States Patent
Mantese (10) Patent No.: US 8,415,761 B2
(45) Date of Patent: Apr. 9, 2013

(54) POLARIZATION ALIGNED AND POLARIZATION GRADED THERMOELECTRIC MATERIALS AND METHOD OF FORMING THEREOF

(75) Inventor: Joseph V. Mantese, Ellington, CT (US)

(73) Assignee: Carrier Corporation, Farmington, CT (US)

( * ) Notice: Subject to any disclaimer, the term of this patent is extended or adjusted under 35 U.S.C. 154(b) by 0 days.

(21) Appl. No.: 13/127,907

(22) PCT Filed: Oct. 30, 2009

(86) PCT No.: PCT/US2009/062801
§ 371 (c)(1),
(2), (4) Date: May 5, 2011

(87) PCT Pub. No.: WO2010/053842
PCT Pub. Date: May 14, 2010

(65) Prior Publication Data
US 2011/0210416 A1 Sep. 1, 2011

Related U.S. Application Data

(60) Provisional application No. 61/111,883, filed on Nov. 6, 2008.

(51) Int. Cl.
*H01L 31/058* (2006.01)
(52) U.S. Cl.
USPC .......... 257/470; 257/14; 257/18; 257/40; 257/428; 257/475; 257/E21.09; 438/54; 438/94

(58) Field of Classification Search .............. None
See application file for complete search history.

(56) References Cited

U.S. PATENT DOCUMENTS
2005/0139249 A1* 6/2005 Ueki et al. ............ 136/211

FOREIGN PATENT DOCUMENTS
| JP | 05-029667 A | 2/1993 |
| JP | 2003-092435 A | 3/2003 |
| JP | 2004-063768 A | 2/2004 |

OTHER PUBLICATIONS

J.L Cui and X.B. Zhao, "The design and properites of pseudobinary alloys (PbTe)1-x-(SnTe)x with gradient composition", Materials Letters, 2003, pp. 2466-2471, vol. 57, Elsevier Science B.V.

(Continued)

*Primary Examiner* — Kyoung Lee
(74) *Attorney, Agent, or Firm* — Cantor Colburn LLP (57) ABSTRACT

Exemplary embodiments of the invention include a thermoelectric material having an aligned polarization field along a central axis of the material. Along the axis are a first atomic plane and a second atomic plane of substantially similar area. The planes define a first volume and form a single anisotropic crystal. The first volume has a first outer surface and a second outer surface opposite the first outer surface, with the outer surfaces defining the central axis passing through a bulk. The bulk polarization field is formed from a first electrical sheet charge and a second opposing electrical sheet charge, one on each atomic plane. The opposing sheet charges define a bulk polarization field aligned with the central axis, and the bulk polarization field causes asymmetric thermal and electrical conductivity through the first volume along the central axis.

23 Claims, 7 Drawing Sheets

OTHER PUBLICATIONS

B.N. Pantha, R. Dahal, J. Li, J.Y. Lin, and H.X. Jiang, "Thermoelectric properties of InxGa1-xN alloys", Applied Physics Letters, Jan. 30, 2008, pp. 042112-1-042112-3, vol. 92, American Institute of Physics.

Rama Venkatasubramanian, Edward Silvola, Thomas Colpitts and Brooks O'Quinn, "Thin-film thermoelectric devices with high room-temperature figures of merit", Nature, Oct. 11, 2011, pp. 597-602, vol. 413, Macmillan Magazines Ltd.

International Search Report mailed Jun. 14, 2010, PCT/US2009/062801, 3 pages.

International Preliminary Report on Patentability mailed May 10, 2011, PCT/US2009/062801, 4 pages.

Written Opinion of the International Searching Authority mailed Jun. 14, 2010, PCT/US2009/062801, 3 pages.

* cited by examiner

POLARIZATION ALIGNED AND POLARIZATION GRADED THERMOELECTRIC MATERIALS AND METHOD OF FORMING THEREOF

CROSS REFERENCE TO RELATED APPLICATIONS

The present application claims the benefit of U.S. Provisional Ser. No. 61/111,883, filed Nov. 6, 2008, the contents each of which are incorporated herein by reference thereto.

BACKGROUND

Thermoelectric materials exhibit a predictable relationship between their electrical and thermal performance. Depending on the desired outcome, a thermoelectric apparatus is frequently arranged as either a cooling/heat pump device or as an electrical power generator. To use the material as a cooling device or heat pump, an electric field is applied across the material, typically via an electric circuit. This field generates a thermal gradient according to the Peltier effect so long as it is maintained. Heat can be removed from the hot side of the material by a heat sink, heat exchanger or other heat removing means. When both are done simultaneously, the apparatus then operates effectively as a cooling device or heat pump. Conversely, creating a thermal gradient across the material, such as by application of thermal energy, induces an electric field according to the Seebeck effect. Connecting the material to a circuit aligned with this field causes the apparatus to operate effectively as an electrical power generator.

There are numerous benefits of applying thermoelectric materials to cooling and electrical power generation. The total size of the thermoelectric materials and ancillary parts of a thermoelectric cooling apparatus can be relatively small compared to the size of an equivalent cooling system with typical components. Most typical cooling systems in current production utilize a vapor compression apparatus, which requires at least a compressor, a working fluid, an expansion valve, an evaporator, and a condenser. Likewise, typical power generation facilities utilize large steam turbines to convert heat energy into electricity. A thermoelectric apparatus is smaller because there is less need to house this large, expensive equipment to convert energy from one form to another. This reduces the amount of space necessary to operate a cooling or power generation system, saving valuable functional space for a manufacturer, designer, or builder. Therefore, the compact size of thermoelectric materials makes them useful for many cooling and power generation applications where space is at a premium.

End users also benefit from the virtual maintenance-free operation of a thermoelectric apparatus. Typical systems as described above use mechanical intermediaries to convert energy between a thermal form and an electrical form, while thermoelectric materials convert energy at the material level. Moving parts such as turbines, motors, and pumps, even if reliable, typically require periodic inspection and maintenance to minimize unplanned outages and major repairs. A thermoelectric apparatus has fewer such ancillary parts, and therefore fewer opportunities for system downtime.

Despite the size and maintenance advantages over current systems, thermoelectric materials have to date been limited to certain niche and specialty applications. Key factors limiting widespread adoption of the technology are high production costs combined with the practical size limits of existing thermoelectric materials. The achievable thermoelectric performance of current materials, especially those designed to operate near room temperature, is also inadequate to make thermoelectric cooling systems competitive for many large scale operations, further restricting broad adoption of current thermoelectric technology.

Current thermoelectric materials are best suited for applications with virtually no cost restrictions, a significant size constraint, or where reliability is more critical than efficiency. For example, current applications include those in remote unattended land-based or space-based operations and those applications operating on a very small scale, particularly in the medical and scientific fields.

Thermoelectric cooling is penetrating the consumer market in certain specialty products such as portable refrigeration units and heated/cooled automotive seats, but has yet to reach wide acceptance. Each of these applications have particular reliability or size requirements that make thermoelectric cooling more attractive than standard vapor compression systems. In products where thermoelectric materials have been applied, specialized needs have dictated use of the current generation of materials, despite their limitations.

The performance of a thermoelectric material is characterized by its dimensionless figure-of-merit, ZT:

$$ZT \equiv \frac{\sigma S^2}{k} T_M, \tag{1}$$

where, $\sigma$ is the electrical conductivity, S is the Seebeck coefficient or thermoelectric power, $T_M$ is the average of the hot and cold side temperatures, and k is the thermal conductivity. As ZT increases, so does the conversion efficiency. While it is desirable to increase ZT by increasing $\sigma$ or reducing k, there has been limited progress in the ability to beneficially change only one factor without causing a counteracting change in the other.

In Equation 1, thermal conductivity, k has two components. Thermal conductivity is the sum of the electrical contribution, $k_{el}$ and phonon contribution $k_{ph}$, or $k=k_{el}+k_{ph}$. Most advances to date in thermoelectric performance have come from fabricating materials with greatly reduced $k_{ph}$. However, $k_{el}$ and $\sigma$ are related by the Wiedemann-Franz law, so that an increase in $\sigma$ typically causes an offsetting increase in $k_{el}$, resulting in no material change to ZT. A reduction in $k_{el}$ can similarly cause an offsetting decrease in $\sigma$. These offsetting changes usually result in no material increase in ZT.

SUMMARY

Exemplary embodiments of the invention include a thermoelectric material having an internal polarization field aligned along a central axis of the material. Perpendicular to the axis are a first atomic plane and a second atomic plane of substantially similar area. The planes define a first volume and form a portion of a single anisotropic unit cell. The bulk polarization field is formed from a first electrical sheet charge and a second opposing electrical sheet charge, one on each atomic plane. The opposing sheet charges define a bulk polarization field aligned with the central axis perpendicular to the first and second atomic planes. The bulk polarization field causes asymmetric thermal and electrical conductivity through the first volume along the central axis.

In another embodiment, a method for forming a thermoelectric device is disclosed. The method comprises forming a thermoelectric material having an internal bulk polarization field that causes asymmetric thermal and electrical conductivity along a central axis of the material. The method further comprises disposing the material between two electrodes and connecting the material to an external circuit such that the internal field is aligned with an applied electrical field or thermal gradient.

DETAILED DESCRIPTION

Figure 1:
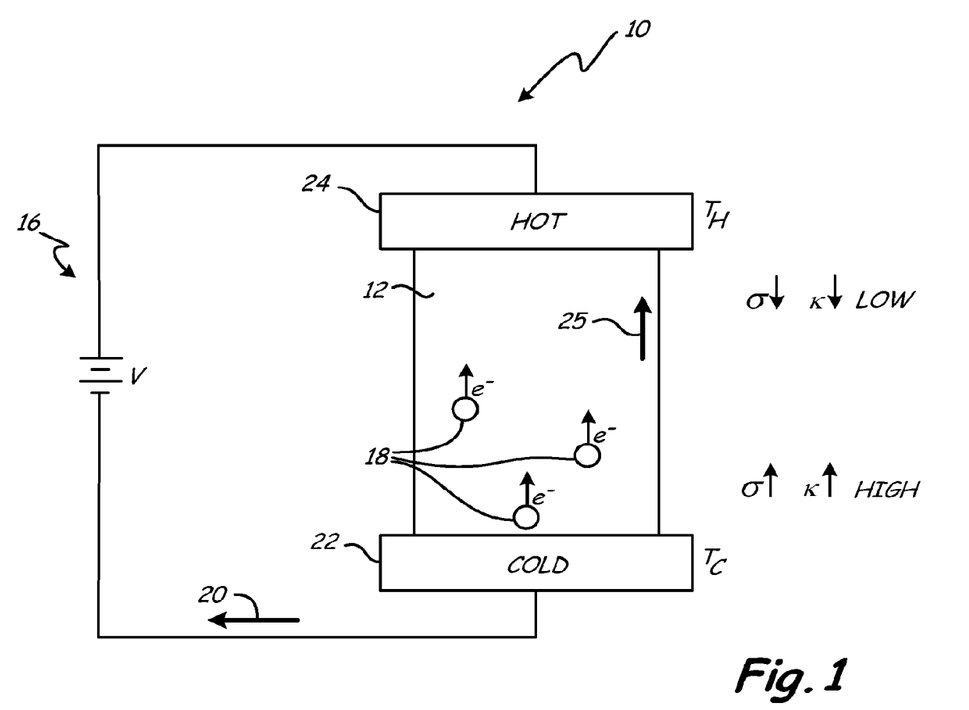
FIG. 1 schematically depicts a thermoelectric cooling apparatus with asymmetric thermal and electrical conductivity.

FIG. 1 depicts a simplified schematic of thermoelectric cooling apparatus 10 utilizing the Peltier effect in thermoelectric material 12 to convert electrical energy into thermal gradient $\Delta T$. When input voltage V is applied to electrical circuit 16, electrons 18 flow in material 12 resulting in current I, in the direction represented by arrow 20. As electrons 18 pass through material 12, thermal gradient $\Delta T = T_H - T_C$ develops from flow of heat Q away from cold side 22 toward hot side 24, as indicated by arrow 25. When heat is removed from hot side 24 via heat rejection means such as a heat sink or heat exchanger (not shown), thermal gradient $\Delta T$ is maintained by current 20 across material 12, inducing continued temperature reduction on cold side 22 until an equilibrium state is reached. Thermal gradient $\Delta T$ results from the relative electrical and thermal energy flows due to the conductivity of charge carriers and acoustic phonons through the structure of material 12.

The thermoelectric performance of material 12 is characterized by its thermoelectric figure of merit, ZT, defined in Equation 1. ZT can be improved by increasing electrical conductivity $\sigma$ and/or decreasing thermal conductivity k. These terms are ordinarily coupled because electrons transport thermal energy in addition to electrical energy. Therefore restrictions on electron flow will reduce conduction of heat as well. This relationship is confirmed by the Wiedemann-Franz law, which states that a change in either $\sigma$ or $k_{el}$ causes a directly proportional change in the other. This proportionality limits or prevents beneficial increases in ZT.

This limitation is overcome by the inventive materials discussed in what follows. The materials contain internal bulk polarization fields that encourage anisotropic electrical and thermal conductivity. The internal polarization fields can align with an external electric field to preferentially force electrons to migrate in one direction, creating a thermoelectric cooler. Similarly, a thermal gradient aligned with the internal polarization field in the correct direction can thus create a thermoelectric power generator.

Asymmetric thermal and electrical conductivity arises when the bulk internal polarization field is aligned in one direction, thereby preferentially lowering the effective energy gap between the valence band and conduction band. The lowered band gap effectively causes more charge carriers with a given energy to reach the conduction band when traveling in the direction of the bulk internal polarization field than those with the same energy traveling in a direction opposite to the internal polarization field. Thus, in one embodiment, when applied electric field from voltage V is correctly aligned with a sufficient bulk internal polarization field schematically illustrated by arrow 25, electrons 18 preferentially carry electrical and thermal energy away from cold side 22 toward hot side 24.

Figure 2A:
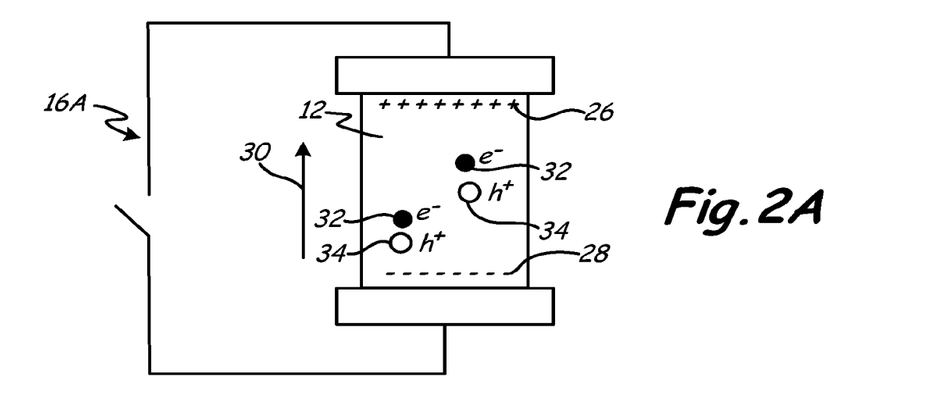
FIG. 2A schematically depicts a thermoelectric apparatus with a material having a bulk polarization field in an open circuit.
Figure 2B:
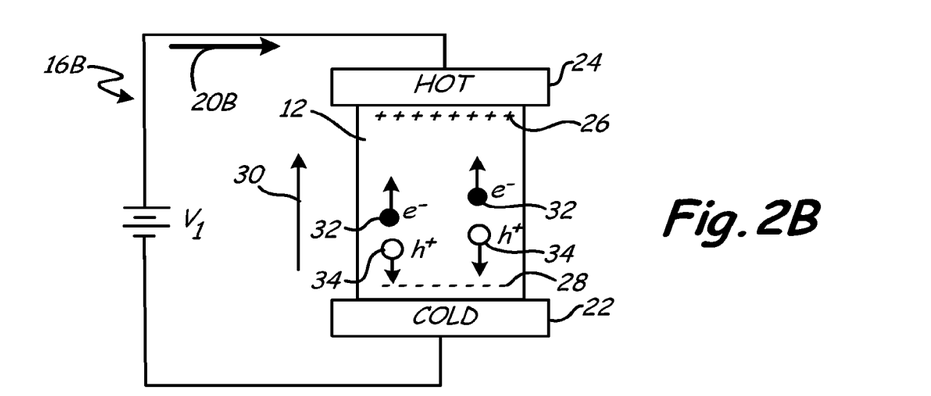
FIG. 2B schematically depicts a thermoelectric apparatus with a material having a bulk polarization field and the effect of an external electric field applied in the same direction.
Figure 2C:
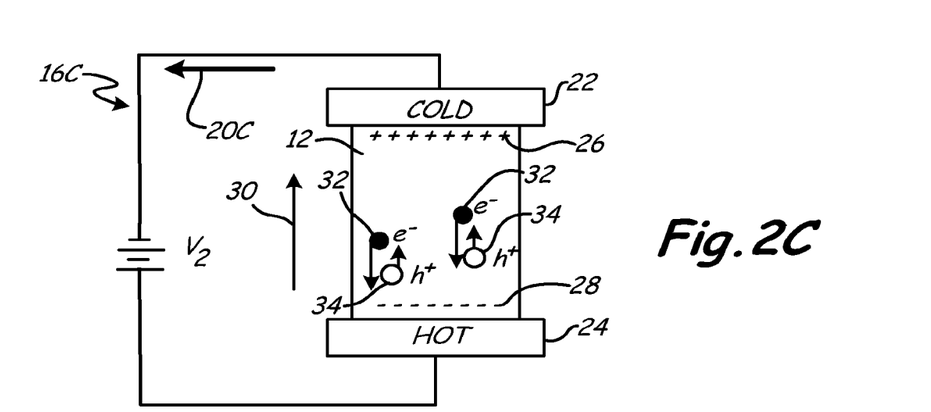
FIG. 2C schematically depicts a thermoelectric apparatus with a material having a bulk polarization field and the effect of an external electric field applied in the opposite direction.

FIGS. 2A, 2B and 2C schematically depict the effect of a bulk internal polarization field on asymmetric conductivity. In each figure, material 12 is connected to circuits 16A, 16B, and 16C, respectively. In each figure, material 12 is an undoped intrinsic semiconductor with an internal bulk polarization field represented by large arrow 30. Arrow 30 indicates the direction of the internal bulk polarization in material 12, positively charged toward a first surface and negatively charged toward a second opposing surface. One method of inducing bulk polarization field 30 is by establishing positive sheet charges 26 at the first surface and negative sheet charges 28 at opposing surface. These opposing surface charges induce an internal field which will selectively enhance electron mobility.

In FIG. 2A, material 12 is a component of open circuit 16A with no applied voltage. Internal polarization field 30 slightly shifts the negatively charged electron cloud away from the positively charged semiconductor lattice. The miniscule shift of the electron cloud can be imagined as a sheet of electrons (−) 28 and a sheet of holes (+) 26. Because there is no applied field (V=0), electrons 32 and holes 34 are not flowing in the bulk, and there is not yet a substantial thermal gradient in material 12.

FIG. 2B illustrates the conductive effect of bulk polarization field 30 toward hot side 24. When external voltage $V_1$ is applied to circuit 16B in the direction shown, excess electrons 32 are drawn through material 12 from cold side 22 toward hot side 24. In addition to applied field $V_1$, electrons are also drawn by positive sheet charge 26 and holes 34 are drawn toward cold side 22 by negative sheet charge 28. Bulk polarization field 30, thus enlarges the difference in electric potential between hot side 24 and cold side 22. This lowering of the effective energy gap between the conduction band and the valence band, improves electron mobility toward hot side 24 and enhances current in circuit 16B as indicated by arrow 20B. Bulk polarization, therefore, improves thermal and electrical conductivity in the direction of field 30, by lowering the band gap for carriers traveling in the desired direction.

FIG. 2C illustrates the blocking effect of bulk internal polarization field 30 on internal current 20C. Voltage $V_2$ is applied to circuit 16C causing electrons to flow away from positive sheet charge 26 and toward negative sheet charge 28. Because electrons are now carrying heat in the opposite direction, hot side 24 and cold side 22 are reversed. Electrons 32 are now being drawn through material 12 toward negative sheet 28 by voltage $V_2$. Holes 34 are also being "pushed" toward positive sheet charge 26. Since internal polarization field 30 separated electrons 32 and holes 34 in the direction opposite the applied field, internal polarization field 30 thus effectively raises the band gap in the direction opposite to polarization. Additional energy must be added in the form of $V_2$ to overcome recombination of electrons 32 and holes 34. Current 20C is now reversed as well. As a result of internal polarization field 30, if $V_1=V_2$ then the magnitude of current 20C is less than that of current 20B.

As described in reference to FIG. 2B, it takes a certain electric field to "pull" electrons 32 through material 12 from cold side 22 to hot side 24. If the external field is reversed, as in FIG. 2C, it will take a far stronger external voltage to overcome internal polarization field 30 and "push" the additional electrons 32 through material 12 from hot side 24 to cold side 22. Electrons 32 can pass all the way through material 12 only if voltage $V_2$ is high enough to overcome the higher band gap and raise enough electrons into the conduction band. In other words, to induce the same current in circuit 16C as 16B, $V_2 \gg V_1$. Regardless of its direction once the external field is removed, electrons 32 and holes 34 separate again because of internal polarization field 30.

It should be noted that bulk internal polarization field 30 and the external field are essentially additive. When the fields are aligned as in FIG. 2B, the effective field is roughly the sum of two numbers with the same sign. When the fields are not aligned as in FIG. 2C, the effective field is the sum of two numbers with opposite sign, i.e. a difference. Thus the key to developing a thermoelectric material with asymmetric conductivity lies in creating this internal polarization field and aligning it in the desired direction of charge carrier mobility.

Materials with isotropic crystal structures have relatively weak internal polarization potential. In contrast to isotropic crystals, many anisotropic crystals form very strong internal electric fields due to the lack of symmetry. An internal electrical polarization field can exist in a material that has a spatially anisotropic distribution of charged ions that form electrical dipoles. This unbalanced distribution of electrical dipoles can occur naturally in non-centro symmetric materials such as wurtzite. It can also occur mechanically by an anisotropic residual strain in a material leading to unbalanced internal electrical dipoles.

Figure 3A:
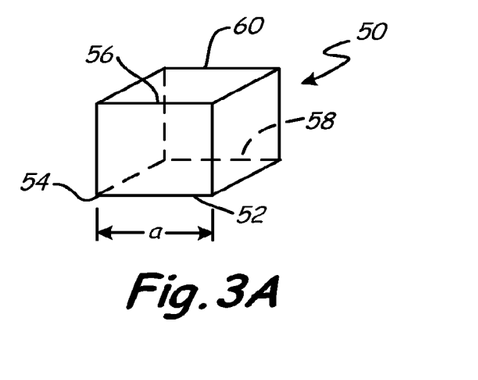
FIGS. 3A and 3B depict a schematic comparison of the lattice parameters of an example anisotropic polarized crystal and an isotropic nonpolarized crystal.
Figure 3B:
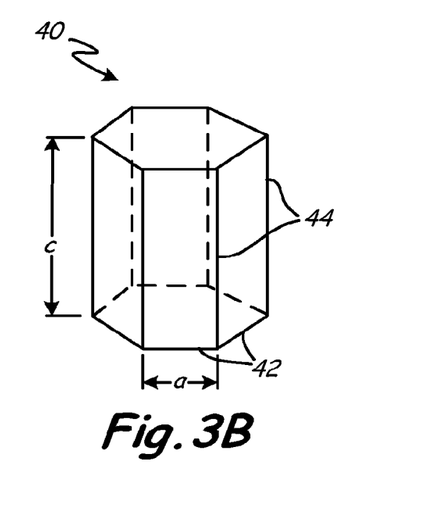

A schematic comparison of materials with an anisotropic crystal structure with strong polarization potential versus an isotropic crystal structure with weak polarization potential is shown in FIGS. 3A and 3B. FIG. 3A schematically depicts a unit cell of zinc-blende 50 having weak polarization potential and FIG. 3B schematically depicts a unit cell of wurtzite 40 having strong polarization potential. Zinc-blende is cubic with three equal lattice constants, a. "Ideal" crystal structures like zinc-blende do not result in spontaneous polarization because of a zero net spatial charge. Regardless of individual bond polarities, the zinc-blende structure results in little or no polarity. For example, even if bond 52 was strongly polar in the direction of atom 54, bonds 56 and 58 would be inversely polar. Bond 60 (the most distant bond from bond 52), would be aligned with 52, because the inverse polarity of 56 and 58 have more effect than the similar polarity of 60. Any remaining polarization effects balance out because of the symmetry of the unit cell, regardless of the polarity of individual bonds.

Polar bonds form because of the ionicity of the constituent atoms. The polarity of a single bond depends on the relative ionicity of the two individual atoms forming it. The ionicity of a particular atom can be described as its willingness to permanently "take" or "give up" one or more outer shell electrons in order to have a full valence band. For example, halides (Group VII) and alkalis (Group I) are strongly ionic. Some well-known and abundant compounds have polar bonds resulting from strong ionicity of its constituent elements. For example, sodium chloride (NaCl) is a mixture of an alkali cation and halide anion but is not very conductive due to its symmetry.

Therefore, to have nonzero net polarity it is important to select a composition with "nonideal" crystals that exhibit a desired anisotropic crystal structure in one direction. A wurtzite crystal can either be ideal or nonideal depending on the particular ratio of lattice constants based on its composition. As shown in FIG. 3B, wurtzite is a hexagonal close packed (HCP) structure. Two unequal lattice constants, a and c, depicted by bonds 42 and 44 respectively, are relevant to the polarization of the crystal. When wurtzite has a c/a ratio of $\sqrt{8/3}$, the unit cell is considered "ideal" and has a net polarization of zero. Like the zinc-blende structure, "ideal" wurtzite's various polar bonds add to form an effective zero net electric dipole in the crystal. However, in the non-ideal form, the polar bonds add to form a non-negative spontaneous electric dipole in the c direction, along bonds 44.

Most semiconductor materials exhibit fairly strong degrees of ionicity, meaning that bonds between two neighboring elements typically have some degree of polarity. Nearly all semiconductors exhibit polar bonding, including many IV-IV semiconductors. However, a material with polar bonding does not necessarily result in a polarized material because of the alignment of the bonds in the crystal structure as described above. Therefore, the strongest bulk polarization fields will form in semiconductor materials with anisotropic crystal structures like wurtzite and tetradymite.

The relevant polarization characteristics of nitride-based wurtzite crystalline materials will be used as examples to illustrate the general use of anisotropic crystal structures to introduce asymmetric conductivity and enhanced thermoelectric performance. However, the use of nitrides as an example class is not intended to exclude other anisotropic crystals such as tetradymite.

In addition to wurtzite, tetradymite is another non-ideal structure formed by semiconductors. Tetradymite is similar to wurtzite with the addition of a center atom in the unit cell. One of the best semiconductor materials is $Bi_2Te_3$, which has a tetradymite structure. By aligning the structure of anisotropic semiconductor materials like $Bi_2Te_3$ in the inventive manner described herein, thermoelectric performance can be greatly enhanced compared to a nonaligned structure. As an example, Table 1 below compares the direct gap, spontaneous polarization, constant ($P_{sp}$), piezoelectric constants ($e_{ij}$), and elastic constants ($c_{ij}$) for a range of nitride semiconductors having wurtzite structures to the much smaller polarization constants in various semiconductors with zinc-blende structures. Table 1 lists several parameters of three example semiconductor materials with nonideal wurtzite structures and several semiconductor materials with ideal zinc-blende structures.

TABLE 1

| | Comparative material properties | | | | | | |
|---|---|---|---|---|---|---|---|
| Material | Lattice constant $a_o$ ($c_o$) Å | Direct Gap (eV) | $P_{sp}$ (C/m$^2$) | $e_{33}$ (C/m$^2$) | $e_{31}$ (C/m$^2$) | $c_{13}$ (GPa) | $c_{33}$ (GPa) |
| GaN | 3.189 (5.185) | 3.4 | −0.029 | 0.73 | −0.49 | 103 | 405 |
| InN | 3.544 (5.718) | 0.7 | −0.032 | 0.97 | −0.57 | 92 | 224 |
| AlN | 3.111 (4.978) | 6.2 | −0.081 | 1.46 | −0.60 | 108 | 473 |
| GaAs | 5.653 | 1.4 | 0 | −0.12 | +0.06 | | |
| InAs | 6.058 | 0.4 | 0 | −0.03 | +0.01 | | |
| InP | 5.870 | 1.4 | 0 | +0.04 | −0.02 | | |
| GaSb | 6.096 | 0.8 | 0 | −0.12 | +0.06 | | |

In the table, the lattice constant is the distance along one edge of a unit cell. In the wurtzite materials, there are two lattice constants, $a_o$ and $c_o$, corresponding to the different parameters along each edge of the unit cell shown in FIG. 3B. The direct gap is the average energy gap between the valence band and conduction band.

The parameters shown in Table 1 support the idea that a semiconductor with a nonideal crystal structure can exhibit polarization while semiconductors with ideal structures like zinc-blende with their inherent symmetry do not. Since semiconductors intrinsically embody some of the best thermoelectric characteristics, those semiconductors with high polarization potential are candidates for strong internal bulk polarization fields.

The spontaneous polarization of each unit cell can be harnessed by growing the material as a single crystal where each pair of atomic layers forms a dipole sheet. These sheets alternate polarity and leave behind a net zero charge in the bulk, but form sheet charges on opposing surfaces. The opposing sheet charges create bulk polarization field 30 through the bulk.

A piezoelectric sheet charge can also be created in addition to the spontaneous charge described above by straining the lattice. Joining two volumes of two different materials at a planar interface with similar but not identical lattice constants causes each individual lattice to be strained at the interface by the other lattice. The result is a sheet charge at the interface, which will be shown later.

If a second related material is added to the opposing surface of the first volume in a similar manner, the first volume becomes "sandwiched." At the opposing interfaces with the two other volumes, the first volume has piezoelectric polarization and corresponding sheet charges. As shown by example below, the materials and order of layering can also be selected such that the spontaneous and piezoelectric polarizations are in the same direction. The "sandwich" effect can also be modified to compositionally grade the first volume creating free charge carriers, which act as bulk dopants. These effects will also be shown later.

As described in reference to FIGS. 3A and 3B, a material with strong polarization potential must also have a crystal structure that takes advantage of the potential. Materials with spontaneous polarization will be discussed first, while the piezoelectric component will be discussed later. Spontaneous polarization, $P_{sp}$, is a fixed polarization in an anisotropic unit cell as described above. A unit cell with spontaneous polarization has an effective dipole in a strain-free state. The dipole results from the ionicity of opposing atoms and their separation in an anisotropic structure.

To understand how a spontaneous dipole is harnessed, it helps to analogize the creation of an internal bulk polarization field to the operation of a capacitor. Referring back to FIGS. 2A-2C, polarized materials 12 have opposing sheet charges on either end of the material. The internal field can be created by arranging polarization in each unit cell to create these sheet charges on two opposing surfaces. A finite charge or a charge shift introduced to the surface of an ordinary material would simply dissipate throughout the material without some other force to orient and fix it in a certain direction. Maintaining the field requires keeping this charge shift stable without the electrons moving to a more equalized energy state throughout the material. This would be done by creating an effective "dielectric."

A spontaneous polarization field can thus be created, for instance, by alternating and "stacking" sheet charges in the c direction of a semiconductor with a wurtzite crystal structure. These sheet charges are formed from individual dipoles between adjacent planes. "Stacking" layers forming a sheet charge with alternating polarity causes a total charge in the material of zero. However, opposing sheet charges 26, 28 on the outer surfaces do not cancel out, creating bulk internal field 30. As it turns out, by filling some or all of the material with alternating sheet charges, the material itself acts as the dielectric to keep the outer surface sheet charges relatively stable.

Random ordering and alignment of these dipoles will not create these sheet charges. It is critical in this example that these materials be grown as undoped single crystals as described in the example below. If the dipoles are misaligned, they will not properly cancel each other inside the material. In that case, some or all of the sheet charges will be attracted to these misaligned dipoles, resulting in random bound energy states and a reduced or nonexistent bulk internal polarization field.

Similarly, unwanted impurities can cause a reduction in the bulk polarization field. If the impurities act as a donor or acceptor atoms, extra charge carriers can be drawn to the outer sheet charges, reducing the overall potential difference between the opposing surfaces and raising the band gap. Further, an impurity with a relatively large or small lattice constant can introduce unwanted lattice strain, affecting the direction and magnitude of the field. At low concentrations, the unit cells are merely aligned away from the central axis, causing a reduction in the bulk polarization component along that axis. At a high enough concentration, the impurities can cause enough lattice strain to generate crystal dislocations, which will draw additional charge carriers to the interface and completely change the alignment of the dipoles surrounding the dislocation.

This sensitivity to impurities means that even otherwise desirable impurities, such as those used in standard semiconductor doping, will counter the effects of polarization. Typically, semiconductors used in electronic applications are selectively doped to increase the number of available charge carriers in the material and create additional energy states between the conduction band and the valence band. Many semiconductors used in thermoelectric applications are also doped for the same reasons. However, for the reasons given above, even selective doping will reduce the bulk polarization field. While selective doping is discouraged, the internal volume can instead be bulk doped via a compositional gradient to create an effective electric field at the interfaces with free charge carriers in between. Methods and effects of bulk doping these materials are described in detail below.

A first volume of a thermoelectric material according to the invention is grown as an unstrained single crystal by layering alternating planes of constituent elements perpendicular to the c direction. Because it is critical that the first volume be unstrained, single crystal materials such as these are typically grown on a substrate with similar lattice parameters to prevent interfacial strain. Several sacrificial layers of the first material can first be deposited on the substrate to orient the crystal and relax lattice strain in the useful portion of the material. The substrate and the sacrificial layers of the first material can be later removed by wet or dry etching or other techniques known in the art.

Figure 4A:
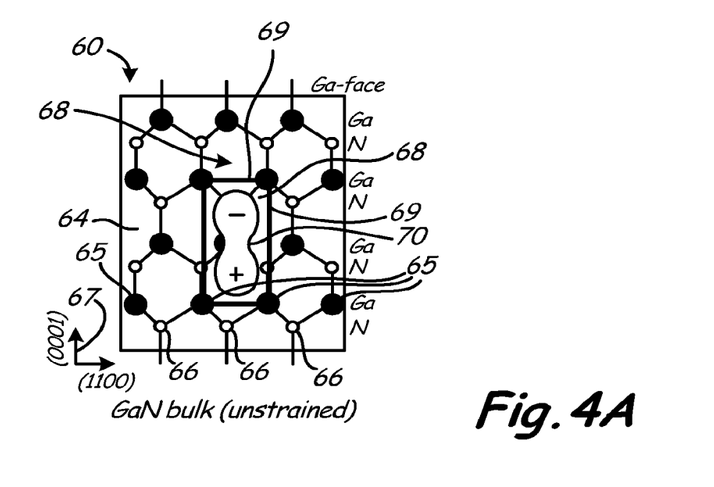
FIG. 4A schematically depicts atomic layers of a thermoelectric material resulting in spontaneous electrical dipole sheets aligned along a crystal plane.
Figure 4B:
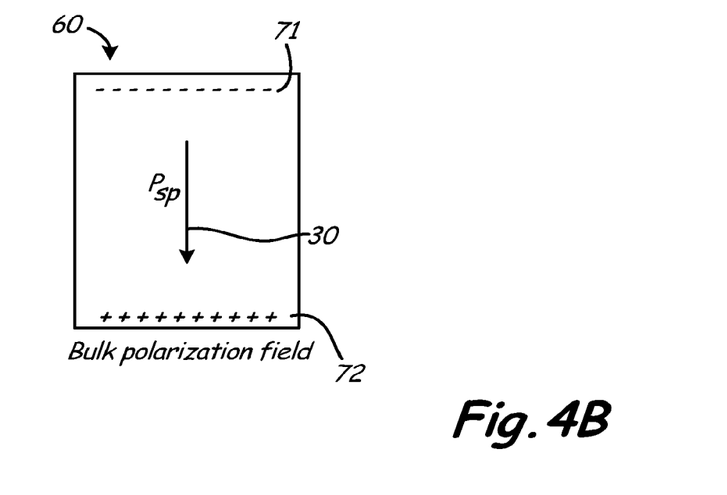
FIG. 4B schematically depicts the bulk polarization field resulting from the aligned dipole sheets depicted in FIG. 4A.

An example of an intrinsic semiconductor material with a spontaneous internal electric field is shown in FIG. 4A. FIG. 4A schematically depicts hexagonal crystal structure 60 of gallium nitride, GaN. The structure consists of alternating planes of negatively charged gallium 65 and positively charged nitrogen 66 atoms stacked perpendicular to [0001] "c axis" 67 of unit cell 68. Unit cell 68 is schematically indicated by rectangular heavy lines 69. Unit cell 68 contains an electric dipole that is formed due to the charge imbalance of the atoms making up the unit cell. The dipoles making up each layer of unit cells neutralize each other in the bulk of the semiconductor but form sheet charges on the surface. This is schematically illustrated in FIG. 4B where negative surface sheet charges 71 and positive surface sheet charges 72 combine to form bulk spontaneous internal polarization $P_{sp}$ vector 30. As shown in FIG. 4B the gallium face of bulk GaN crystal is negatively charged and the N face is positively charged.

In this example, the material is grown as an unstrained single crystal 60 with alternating layers of Ga and N atoms. Single crystal materials such as these are typically epitaxially grown on an insulating substrate with similar lattice parameters to minimize interfacial strain. For example, wurtzite materials have lattice constants on the hexagonal plane similar to alumina, $Al_2O_3$, making it a potentially useful substrate in this case. Several layers of GaN 60 would first be deposited on the alumina substrate to orient the crystal and relax lattice strain before a useful portion 64 of the material is deposited. Strained GaN 60 and the substrate can be later removed by etching, ion milling, or other techniques known in the art.

In addition to nitride-based wurtzite structures, this invention can apply to other anisotropic structures as well. One such example is a tetradymite form of bismuth telluride ($Bi_2Te_3$). A layer of negatively charged tellurium or positively charged bismuth is deposited on a strain-relaxed substrate. The complementary element is then deposited on the next layer. Successive alternating layers can then be grown to form an aligned $Bi_2Te_3$ crystal with spontaneous internal polarization.

As discussed, the nitride-based semiconductors used as examples above do not cover the full extent of materials available in various embodiments of the invention. In addition to nonideal wurtzite structures, materials with any anisotropic crystal structure fabricated in the general manner described herein can have spontaneous internal polarization. In certain embodiments, those crystals include materials with a tetradymite structure. Whether the material comprises a single layer or several layers, certain chemical elements tend to form these nonideal crystals. Several examples of these elements include bismuth (Bi), antimony (Sb), lead (Pb), tellurium (Te), and selenium (Se). In certain embodiments, Bi, Sb, or Pb are used in the positively charged planes while Te and Se are generally used in the negatively charged planes.

To summarize, in one embodiment of the invention, the material comprises a first undoped semiconductor material with an anisotropic crystal structure and chemical formula $A_xB_y$. Elements A and B are distinct chemical elements and x and y represent a stoichiometric ratio of elements A and B. A first plurality of atoms of chemical element A are layered in a first plane on a strain-relaxed substrate and comprise a distinct charge. Next, a second plurality of atoms of chemical element B with a distinct opposite charge are layered in a second plane on the plurality of atoms of chemical element A, thereby creating a bulk polarization field in the direction of anisotropy perpendicular to the first and second planes. The polarization field results from spontaneous polarization between adjacent layers of elements A and B, causing asymmetric thermal and electrical conductivity along the central axis.

Figure 5A:
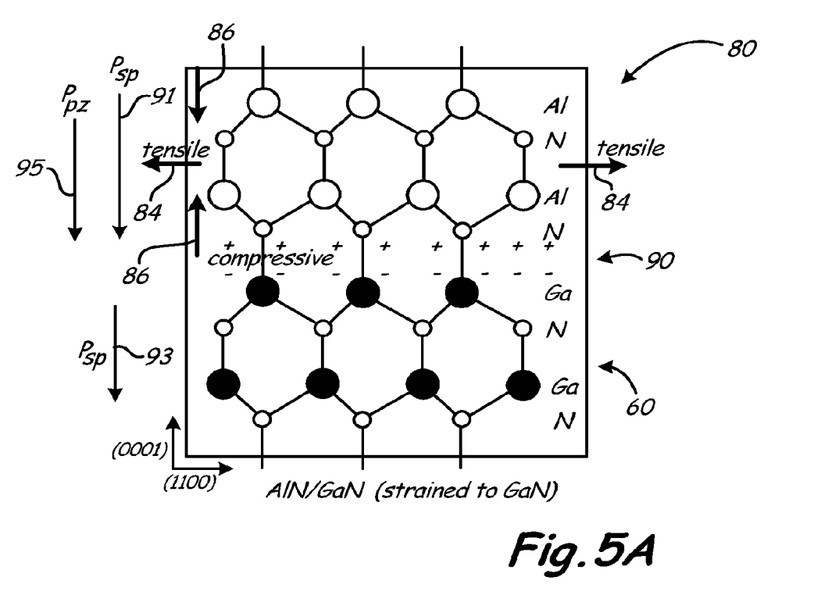
FIG. 5A schematically depicts atomic layers of a thermoelectric material resulting in piezoelectric dipole sheets at an interface between two aligned volumes.
Figure 5B:
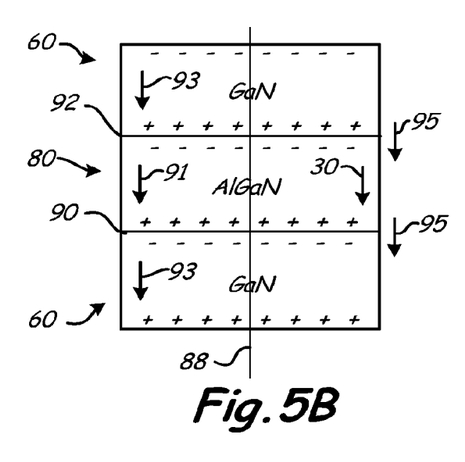
FIG. 5B schematically depicts a thermoelectric material having a pseudomorphic volume between two uniform volumes, resulting in piezoelectric dipole sheets at an interface between two aligned volumes.
Figure 5C:
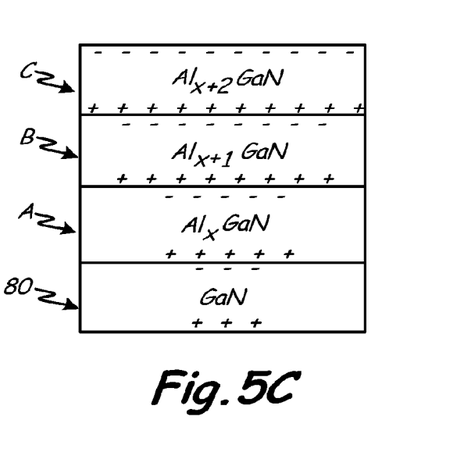
FIG. 5C schematically depicts a thermoelectric material having a plurality of uniform pseudomorphic subvolumes, with a compositional gradient in each successive subvolume.

While a spontaneous internal polarization field can form according to FIGS. 4A and 4B, the much stronger piezoelectric potential has not yet been captured. FIGS. 5A-5C illustrate how the piezoelectric potential can also be captured to produce sheet charges and the resulting internal polarization. Piezoelectric polarization comes from a temporary or permanent deformation in the shape of a unit cell caused by asymmetric stresses. The resulting deformation reorients the relative positions of charged nuclei in the lattice. The new orientation of positive charges causes a compensating electrostatic charge. This new orientation thus changes the relative polarity of each bond, and results in an internal polarization field due to the deformation.

Deformation of semiconductors with the wurtzite structure generate a piezoelectric polarization along the same c direction as the spontaneous polarization shown in FIG. 3B. As seen in Table 1 above, the piezoelectric constants $e_{ij}$ of a given wurtzite material are at least an order of magnitude greater than that in zinc-blende structures. Straining a wurtzite material in the hexagonal plane will thus add a significant component of piezoelectric polarization to the spontaneous polarization in the c direction.

When the strain is aligned along the c or [0001] direction, the piezoelectric polarization is:

$$P_{pz} = 2\left(e_{31} - e_{33}\frac{c_{13}}{c_{33}}\right)E_1 \qquad (2)$$

The coefficients in Table 1 are the relevant factors for determining piezoelectricity in wurtzite crystals. In equation 2, $E_1$ is the strain in the [0001] plane, $e_{ij}$ are the relevant piezoelectric coefficients and $c_{ij}$ are the relevant elastic coefficients. The subscripts reference the direction of the coefficient, where 33 is equivalent to the [0001] direction.

Materials can be chosen and fabricated such that the piezoelectric and spontaneous polarization fields are aligned. If a volume of a second material with a smaller in-plane lattice constant is grown on a material with a spontaneous polarization field, this creates an additional piezoelectric field in line with the spontaneous field. For example, FIGS. 5A and 5B depict a volume of AlN grown on the [0001] plane of the GaN substrate of FIG. 4.

FIG. 5A schematically depicts a cross-section perpendicular to the [0001] layer of wurtzite semiconductor AlN 80 epitaxially grown on an [0001] layer of wurtzite semiconductor GaN 60. Here, [0001] plane 90 indicates the interface between AlN 80 and GaN 60. The spontaneous internal polarization $P_{sp}$ of AlN is indicated by arrow 91. The spontaneous internal polarization of GaN is indicated by arrow 93. As seen in Table 1, AlN has a smaller lattice constant than GaN. As a result, the AlN in the vicinity of the interface is under tension if epitaxy is maintained. This creates tensile stress denoted by arrows 84 parallel to the interface and compressive stress denoted by arrows 86 normal to the interface. The resulting compressive stress normal to the interface generates a piezoelectric polarization $P_{pz}$, indicated by arrow 95 normal to the interface in the same direction as the spontaneous polarization of AlN $P_{sp}$ indicated by arrow 91 and spontaneous polarization $P_{sp}$ of GaN indicated by arrow 93. Thus, the additional piezoelectric polarization in AlN adds to the spontaneous internal polarization. In addition, the additional piezoelectric polarization at the interface can be depicted as a sheet charge at interface 90 diagrammatically illustrated by the symbols − and +.

To summarize, in one embodiment of the invention, the thermoelectric material comprises alternating epitaxial layers of semiconducting thermoelectric materials with lattice mismatch induced piezoelectric polarization that combines with the bulk internal polarization field of the structure. The resulting internal polarization field causes asymmetric thermal and electrical conductivity along the central axis of the layers.

In FIG. 5B, a second cap layer of GaN 60 is placed atop the GaN/AlN structure illustrated in FIG. 5A. Placement of this third layer causes a second polarization sheet charge to form at second interface 92. Piezoelectric sheet charges at interfaces 90 and 92 create polarizations 95 that add to spontaneous polarizations 91 and 93 and form a strong internal field along axis 88.

In contrast to the above, it is seen from Table 1 that wurzite semiconductor InN has a larger lattice constant than GaN. If InN were epitaxially grown on GaN, the interfacial stress state in the InN layer would be compressive and the stress normal to the interface would be tensile and the resulting piezoelectric polarization would cancel part of the spontaneous polarization in the structure since it would be aligned in the opposite direction. Another disadvantage of InN is the magnitude of its lattice constant relative to GaN. Unlike AlN, InN cannot form pseudomorphic layers with GaN. This is significant because pseudomorphic layers are important for certain embodiments discussed below.

Internal polarization in epitaxial semiconductors is limited to thin layers. As the layer thickness increases, the field due to the surface charges approaches the band gap. When the band gap is reached, the resulting electron flow neutralizes the internal field and the polarization is lost. The process is similar to the electrical breakdown of a capacitor. Another way to visualize this process is to consider the structure shown in FIG. 5B. In FIG. 5B, epitaxial AlGaN layer 80 is sandwiched between epitaxial GaN layers 60 where the layers meet at interfaces 90, 92. Bulk internal field 30 in layer 80 results from sheet charges at interfaces 90, 92 and spontaneous polarization 91 of AlGaN layer 80. Internal field 30 causes the band gap to be sloped. As the thickness of first volume 80 is increased, eventually, valence electrons from the opposite end will migrate to balance the charge. The migration creates a neutralizing dipole. The thickness at which this dipole forms is the critical thickness, $d_{cr}$. Beyond this thickness, additional steps must be taken to maintain internal field 30 or the benefits of the polarization field are lost.

The thickness limitation can be used advantageously in several embodiments of the invention. The thickness and strength of each dipole sheet can be manipulated by "gradient doping" each layer. Gradient doping is a way of bypassing the thickness limits on these materials by selectively doping and capturing the benefits of the piezoelectric polarization.

A gradient-doped material has a compositional gradient which includes the substitution of a third element into the composition in each succeeding layer as the material is fabricated layer by layer. Linear compositional gradients are preferred but are not required. The following figures describe the mechanism and purpose of a compositional gradient and its effect on the internal polarization field and thermoelectric performance.

As in a real capacitor, note that below the critical thickness of the second volume where the internal field equals the band gap ($d<d_{cr}$), a strong electric field, E, can be maintained. In fact, as the second volume gets thinner ($d<<d_{cr}$), it can sustain a much larger field, E, without breaking down. However, reducing d can also reduce E because E in this material is induced in significant part by the lattice strain caused by the middle layer. At the same time, dislocations can form because of excessive lattice strain if it is too thin. Therefore, balance must be created between the composition of the second volume and its thickness, d.

The balance between d and E comes in the form of a pseudomorphic volume with minimal difference in lattice parameters. In FIG. 5B pseudomorphic volume 80 is sandwiched between two volumes of polarization aligned material 60. A bulk polarization field is formed by spontaneous and piezoelectric polarizations in all three volumes and at the two interfaces. When volume 80 is compositionally uniform, this results in an electron gas bound at first interface 90 and a hole gas bound at second interface 92.

A graded volume can be imagined as a plurality of uniform subvolumes as described with reference to FIG. 5C. Creating a uniform pseudomorphic subvolume results in an electron gas at one end and a hole gas at the opposite end. If the composition of each subvolume varies by a certain amount, each successive subvolume can thus sustain successive layers of electron gas and hole gas over a small distance. Polarization in AlGaN is larger than in GaN and keeps increasing as the Al-composition increases. The polarization in each successive subvolume (A, B, C, etc.) results in a net positive internal polarization.

Figure 6:
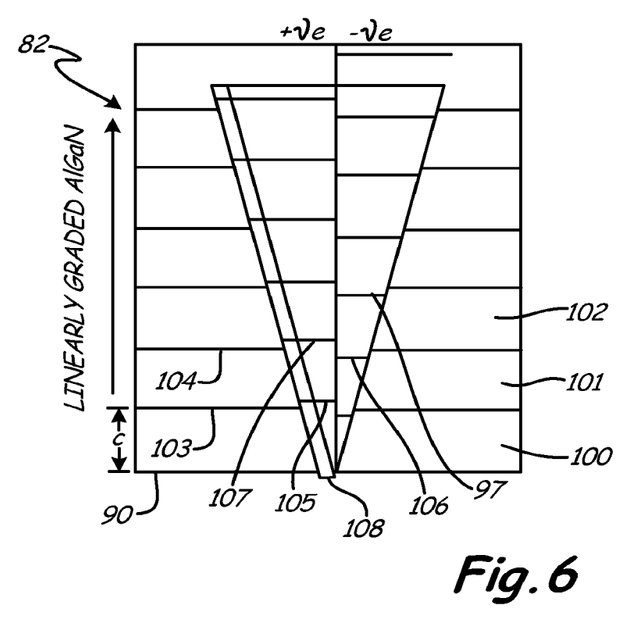
FIG. 6 schematically depicts fixed unbalanced charges in each subvolume of a compositionally graded material, and the resulting fixed volume charge.

FIG. 6 schematically depicts the effect of a composition gradient on the internal polarization of AlGaN. Single crystal 82 consists of layers of unit cells 100, 101, 102 stacked on top of one another in the c [0001] direction forming interfaces 103 and 104. The polarization in each layer is indicated by horizontal lines depicting the strength of the dipole. For instance, in layer 101, the positive charge of the dipole is indicated by the length of line 105 and the negative charge is indicated by the length of line 106; canceling out the charge within layer 101. Additions of aluminum to each AlGaN layer grown on a Ga/Al face increases the internal polarization as shown. Like negative charge 106, positive charge 107 from layer 102 is also located at interface 104. Since positive charge 107 is greater than negative charge 106, graded structures grown in this manner have a net positive polarization charge as indicated by the positive dipole length in region 108 of FIG. 6. Therefore, by compositionally grading each layer of III-V semiconducting nitride crystals such as AlGaN, a fixed polarization charge can be established in the material. Although the fixed charges do not contribute to the electrical conductivity directly, the electric field that is provided is large enough to attract carriers from available sources of charge such as the surface, remote dopants, etc. to form a three-dimensional mobile electron body. This process is termed "polarization bulk doping".

The direction of polarization is determined by the orientation of the composition gradient. If the aluminum content is increasing as it is in FIG. 6, the net positive polarization is directed up. Conversely if the aluminum content is decreasing in the vertical direction the net positive polarization is pointing down. In certain embodiments, several bulk doped, polarization graded layers can be fabricated as part of a single material. Like the example described above, each layer with concentration gradient is sandwiched between two non-graded layers, which results in effective bulk doping in each graded layer.

To summarize, in this embodiment of the invention, the thermoelectric material comprises a stack of epitaxial layers of semiconductor material $A_{x-y}B_yC_z$ wherein composition Z of semiconductor element C is continually varied through the stack to generate an internal polarization field aligned along the central axis causing asymmetric thermal and electrical conductivity.

Figure 7:
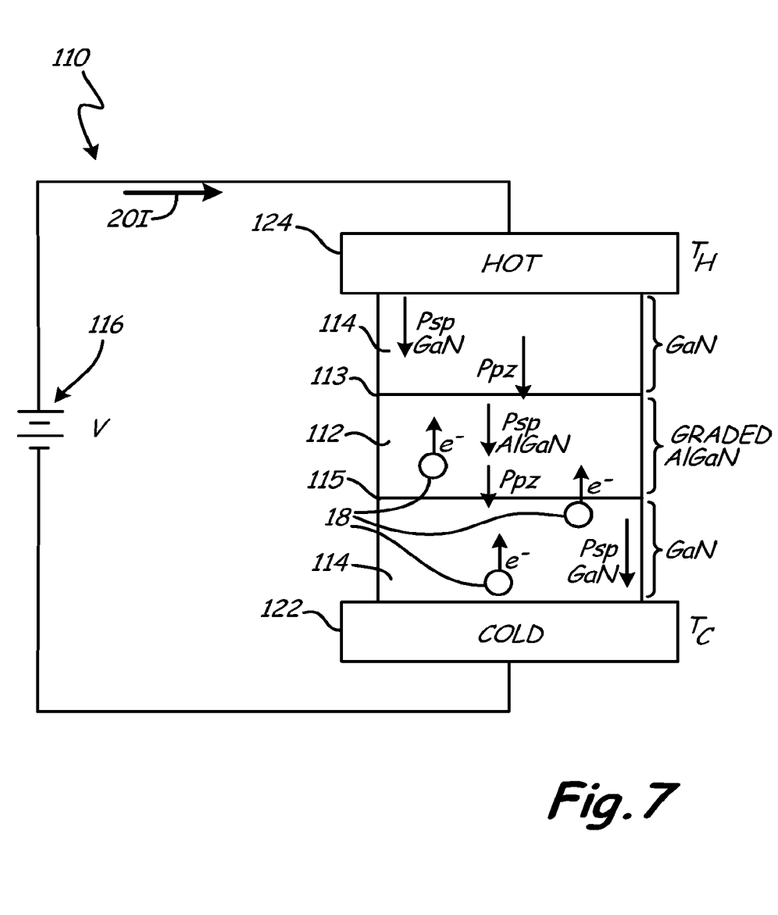
FIG. 7 schematically depicts a thermoelectric apparatus with a compositionally graded and polarization duped material with total internal polarization contributing to assymetic thermal conductivity. Spontaneous polarization Psp and piezoelectric polarization $P_{pz}$, are schematically indicated.

FIG. 7 is similar to FIG. 2B respectively. FIG. 7 depicts thermoelectric cooling apparatus 110 comprising circuit 116 containing a thermoelectric stack containing compositionally graded AlGaN material 112 with spontaneous polarization $P_{spAlGaN}$, GaN material 114, with spontaneous polarization $P_{spGaN}$, and piezoelectric polarization $P_{pz}$ at interfaces 113 and 115. The polarizations all contribute to asymmetric thermal conductivity of thermoelectric material 112 in simplified thermoelectric cooling apparatus 110. Circuit 116 includes voltage V applied to materials 112 and 114. Apparatus 110 receives both benefits of spontaneous polarization and bulk doping in material 112. Thermal and electrical energy preferentially travel toward hot side 24 when voltage V is aligned.

The thermoelectric performance of these materials are targeted toward $k_{el}$ and $\sigma$. Phonon blocking structures such as superlattices, nanowires, and quantum dots may also be incorporated in key locations throughout the internally polarized material to simultaneously reduce $k_{ph}$ and further increase ZT.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A thermoelectric device comprising a thermoelectric material disposed between two electrodes and connected to an electrical circuit, wherein the thermoelectric material comprises a first compound semiconductor having an internal bulk polarization field and asymmetric thermal and electrical conductivity.

2. The thermoelectric device of claim 1, wherein the internal polarization field is parallel to a central crystal axis of the thermoelectric material.

3. The thermoelectric device of claim 1, wherein the internal polarization field comprises a spontaneous polarization component or a piezoelectric polarization component.

4. The thermoelectric device of claim 3, wherein the thermoelectric material comprises a first layer of alternating planes of positively charged ions and negatively charged ions (sheet charges) oriented perpendicular to the central crystal axis, defining an anisotropic crystal structure.

5. The thermoelectric device of claim 4, wherein the anisotropic crystal structure comprises a non-ideal wurtzite or tetradymite structure.

6. The thermoelectric device of claim 1, wherein the first compound semiconductor crystal has the chemical formula $A_xB_y$ wherein A is at least one of bismuth (Bi), antimony (Sb) and lead (Pb), B is at least one of tellurium (Te) and selenium (Se), and x and y are the relative stoichiometric amounts of A and B.

7. The thermoelectric device of claim 4, wherein the thermoelectric material further comprises a second layer of a second compound semiconductor with spontaneous internal polarization and differing lattice parameters, the second layer being epitaxially formed on the first layer such that the interface between the first and second layers is strained.

8. The thermoelectric device of claim 7, wherein the interfacial strain generates a piezoelectric polarization component of the internal bulk polarization field.

9. The thermoelectric device of claim 7, wherein the second semiconductor has the chemical formula $C_mD_n$, C is at least one of bismuth (Bi), antimony (Sb) and lead (Pb), D is at least one of tellurium (Te) and selenium (Se), and m and n are relative stoichiometric amounts of C and D.

10. The thermoelectric device of claim 7, wherein the thermoelectric material further comprises a third layer $A_xB_y$ epitaxially formed on the second layer.

11. The thermoelectric device of claim 10, wherein the thermoelectric material further comprises at least one additional pair of alternating layers $C_mD_n$ and $A_xB_y$ epitaxially formed on the third layer $A_xB_y$.

12. The thermoelectric device of claim 4, wherein at least one layer of the thermoelectric material comprises a compound semiconductor having a third chemical element with stoichiometric ratio, z, and wherein continually increases or decreases in the layer along the central axis, resulting in a concentration gradient and a piezoelectric polarization field perpendicular to the planes of the layer.

13. The thermoelectric device of claim 1, wherein the internal bulk polarization field causes the electronic contribution, $k_{el}$ of thermal conductivity in the thermoelectric material to be anisotropic such that $k_{el}$ is higher in a first direction along the central crystal axis and lower in a direction opposite the first direction.

14. A method for forming a thermoelectric device, the method comprising:
    forming a thermoelectric material having an internal bulk polarization field, the field causing asymmetric thermal and electrical conductivity along a central axis;
    disposing the material between two electrodes; and
    connecting the material to an external circuit such that the internal field is aligned with an applied electrical field or thermal gradient.

15. The method of claim 14, wherein forming the thermoelectric material comprises forming a second atomic plane B onto a first atomic plane A, each adjacent plane being perpendicular to the central axis and having opposing electrical sheet charges, with the opposing sheet charges resulting in a spontaneous polarization component of the internal polarization field.

16. The method of claim 14, wherein the thermoelectric material comprises an anisotropic crystal having a non-ideal wurtzite or tetradymite crystal structure.

17. The method of claim 15, wherein the plurality of atomic planes A and B define a first layer of first compound semiconductor crystal with chemical formula $A_xB_y$.

18. The method of claim 17, wherein A is at least one of bismuth (Bi), antimony (Sb) and lead (Pb) and B is at least one of tellurium (Te) and selenium (Se).

19. The method of claim 17, wherein forming the thermoelectric material further comprises epitaxially forming alternating planes of chemical elements C and D on the first layer of AxBy, the planes of elements C and D defining second compound semiconductor $C_m D_n$ on wherein C is at least one of bismuth (Bi), antimony (Sb) and lead (Pb), D is at least one of tellurium (Te) and selenium (Se), and m and n are the relative stoichiometric ratios of C and D.

20. The method of claim 19, wherein forming the thermoelectric material further comprises epitaxially forming a third layer of $A_x B_y$ onto second layer $C_m D_n$.

21. The method of claim 19, wherein $A_x B_y$ and $C_m D_n$ have differing lattice parameters such that the interface between the layers is strained, the interfacial strain resulting in a piezoelectric component of the internal bulk polarization field.

22. The method of claim 14, wherein the first layer $A_x B_y$ is formed on an insulating layer.

23. The method of claim 14, wherein at least one layer comprises a compound semiconductor having a formula $A_{x-z} B_y C_z$ or $C_{m-z} D_n A_z$, wherein z continually increases or decreases through each plane in the layer along the central axis resulting in a concentration gradient and a piezoelectric polarization field parallel to the central axis.

* * * * *